(12) United States Patent
Anderson et al.

(10) Patent No.: US 6,369,397 B1
(45) Date of Patent: Apr. 9, 2002

(54) SPM BASE FOCAL PLANE POSITIONING

(75) Inventors: Brent A. Anderson, Jericho; James A. Bruce, Williston; Steven J. Holmes, Milton; Peter H. Mitchell, Jericho, all of VT (US); Robert A. Myers, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/225,120

(22) Filed: Jan. 4, 1999

(51) Int. Cl.[7] .......................... G01N 13/10; H01J 37/30
(52) U.S. Cl. .................. 250/492.2; 250/306; 250/307; 250/491.1
(58) Field of Search ................ 250/306, 307, 250/398, 492.2, 491.1

(56) References Cited

U.S. PATENT DOCUMENTS

| | | |
|---|---|---|
| 4,677,301 A | 6/1987 | Tanjimoto et al. |
| 4,914,293 A * | 4/1990 | Hayashi et al. ............. 250/306 |
| 5,081,353 A * | 1/1992 | Yamada et al. ........... 250/491.1 |
| 5,116,782 A * | 5/1992 | Yamaguchi et al. ........ 437/172 |
| 5,124,927 A | 6/1992 | Hopewell et al. |
| 5,150,392 A | 9/1992 | Hohn et al. |
| 5,155,359 A * | 10/1992 | Monahan ..................... 250/307 |
| 5,227,626 A | 7/1993 | Okada et al. |
| 5,256,876 A | 10/1993 | Hazaki et al. |
| 5,308,974 A | 5/1994 | Elings et al. |
| 5,317,141 A | 5/1994 | Thomas |
| 5,354,985 A | 10/1994 | Quate |
| 5,497,007 A * | 3/1996 | Uritsky et al. ........... 250/491.1 |
| 5,508,517 A * | 4/1996 | Onuki et al. ................. 250/306 |
| 5,517,280 A | 5/1996 | Quate |
| 5,666,190 A | 9/1997 | Quate et al. |
| 5,729,026 A * | 3/1998 | Mamin et al. ........... 250/492.2 |
| 5,751,004 A | 5/1998 | Robinson et al. |

* cited by examiner

*Primary Examiner*—Bruce Anderson
(74) *Attorney, Agent, or Firm*—Scully, Scott, Murphy & Presser; William D. Sabo

(57) ABSTRACT

A method and apparatus for positioning a wafer in an electron beam lithography system. This method includes the steps of positioning a scanned probe microscope in the lithography system, and determining the distance between a preset location on the scanned probe microscope and a reference position in the lithography system. The wafer is brought into physical contact with that preset location, and then the wafer is moved a predetermined distance from the preset location on order to position the wafer at the desired focal plane in the lithography system.

16 Claims, 3 Drawing Sheets

SPM BASE FOCAL PLANE POSITIONING

BACKGROUND OF THE INVENTION

This invention generally relates to electron beam lithography systems, and more specifically, to methods and apparatus for positioning a wafer in such systems.

Electron beam lithography systems are used to make large scale integrated circuits. A principle advantage of these systems is that they may be used to manufacture extremely fine lines. For example, electron beam writing systems may be used to form lines having widths of less than 0.05 $\mu$m with an alignment tolerance of less than 0.02 $\mu$m.

In the operation of an electron beam lithography system, an electron beam is generated and directed through one or more masks or reticles that shape the cross section of the beam into a desired pattern. The shaped beam is then directed onto a wafer to form, or write, a pattern on the wafer, and typically the cross-sectional pattern of the beam is transferred into an electron sensitive polymer layer on the top surface of the wafer. That pattern may be formed in one exposure of the wafer to the electron beam, a procedure referred to as "one shot."

The surface of the wafer must be placed in the correct z-plane prior to exposure to insure that images are projected from the mask to wafer "in focus". The time to measure and adjust focus must be made small to achieve high exposure tool parts per hour capability. Current techniques for determining the z-location of the wafer surface are optical reflectance, capacitive gauges, and air gauges. These techniques can be influenced by the presence of underlying films, and may not repeatedly measure the top surface location.

For instance reflectance measurements may indicate a different z-position of the top surface, when in fact all that has changed is the film stack on the wafer. Capacitive gauges are inaccurate at wafer edges due to fringing of electrical fields as the gauge moves off the wafer. Also, capacitive gauges must be calibrated for each film stack combination to obtain absolute values of wafer surface position. This is because the capacitive measurement is sensitive to material thickness and electrical properties of the stack. Air gauges have bandwidth and response time limitations which may limit exposure tool speed. Air gauges sometimes introduce unwanted contamination.

SUMMARY OF THE INVENTION

An object of this invention is to control wafer z-axis position accurately in lithography exposure tools.

Another object of the present invention is to use a scanned probe microscope or SPM to control the z-axis positioning of a wafer is an electron beam lithography system.

A further object of this invention is to provide a method and system, using an SPM, that may be effectively employed in an electron beam lithography system to determine the z-axis positioning of a wafer over various types of topography.

These and other objectives are attained with a method and apparatus for positioning a wafer in an electron beam lithography system. This method includes the steps of positioning a scanned probe microscope in the lithography system, and determining the distance between a preset location on the scanned probe microscope and a reference position in the lithography system. The wafer is brought into physical contact with that preset location, and then the wafer is moved a predetermined distance from the preset location on order to position the wafer at the desired focal plane in the lithography system.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENT

Figure 1:
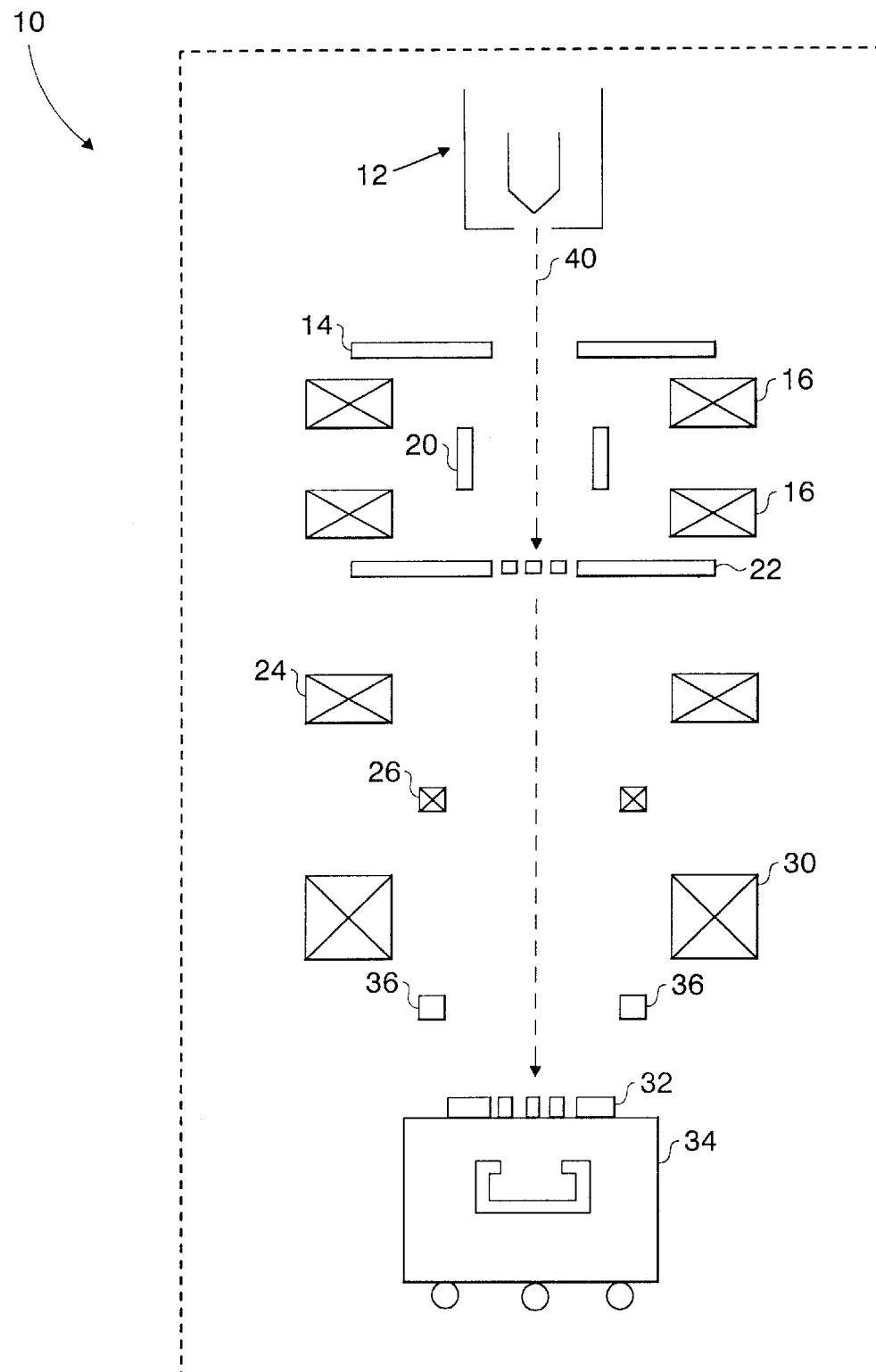
FIG. 1 illustrates an electron beam writing system.

FIG. 1 schematically illustrates an electron beam writing system 10 comprising electron gun 12, diaphragm 14, condenser and illumination lenses 16, deflection plates 20, reticle 22, reduction lens 24, rotation lens 26, objective lens 30, wafer 32, stage 34 and back scatter detectors 36. In this system, electron gun 12 emits electron beam 40 and directs that beam through diaphragm 14, which forms the beam into a particular cross-sectional shape. The shaped beam is then projected by lens 16 and plates 20 onto reticle 22, which further forms the cross-sectional shape of the beam.

Once the final shape of the beam is determined, reduction lens 24 may be used to reduce the size, or magnification, of the beam, and rotation and objective lenses 26 and 30 may be used to adjust the rotation and orthogonality of the beam. The beam 40 is then incident on wafer 32, which is supported by stage 34, and the beam forms a pattern on the resist coated wafer. Back scatter detectors 36 may be provided to detect and to generate signals representing the intensity of the electrons scattered upward from wafer 32.

Conventional or standard elements may be used in system 10. In addition, as will be understood by those of ordinary skill in the art, system 10 may be provided with additional or different elements depending on the intended use of the system.

As previously mentioned, it is important that the surface of the wafer be placed in the correct Z-plane prior to exposure. In accordance with the present invention, one of the varied Scanned probe metrology (SPM) techniques (which include scanned or atomic force microscopy) is used to determine relative position of one object (e.g., the wafer) with respect to another object (e.g., the lens). The SPM probe is moved to contact the first object while interferometry is used to measure the distance between the second object and the SPM probe. A scanned probe microscope, as that term is used herein, includes all microscopes that operate by scanning a fine-tipped probe over the surface of an object and, by directly or indirectly monitoring interactions between the probe and the surface, to determine characteristics or properties of the surface. Such properties include, for example, topographic features and conductivity.

Figure 2:
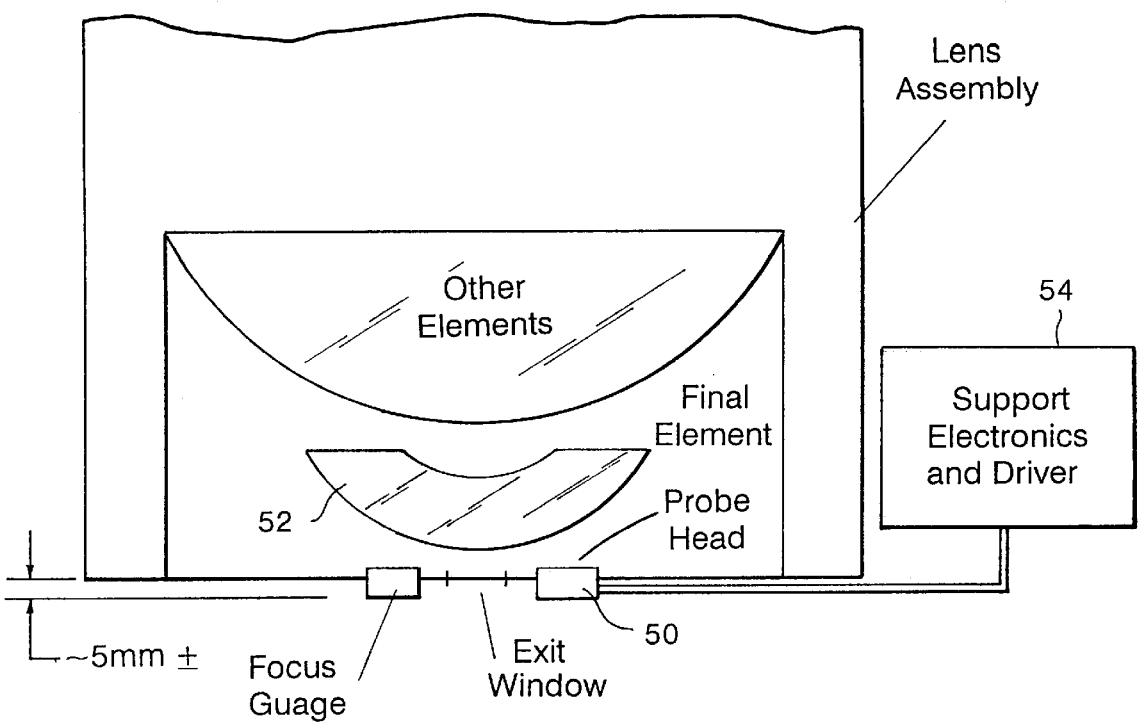
FIG. 2 shows an apparatus for positioning a wafer in the writing system of FIG. 1.
Figure 3:
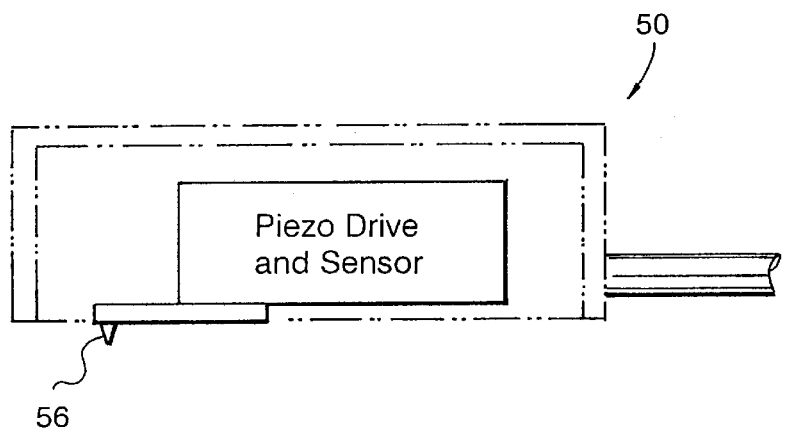
FIG. 3 is an enlarged view of a probe head of the apparatus shown in FIG. 2.

More specifically, with reference to FIGS. 2 and 3, for the case of a lithographic stepper/scanner, a SPM probe 50 is mounted directly to the lens hardware 52, off to the side of the bottom lens element housing. The probe is then lowered using drive means 54 (or the wafer is raised) until the wafer surface is detected by the SPM. Then, the stage 34 is adjusted to the proper height for exposure (using stage micrometers/interferometers) as determined by calibration wafers. This could also be performed in a dynamic mode, with the SPM probe contacting the wafer surface while the wafer is moving. This technique ensures that the wafer surface is precisely positioned because the distance between the lens and the best focal plane is determined using calibration wafers, the wafer is brought to the SPM tip, the distance between the SPM tip and the lens is known, and stage micrometers and interferometers drive the stage to the best focal plane.

Figure 4:
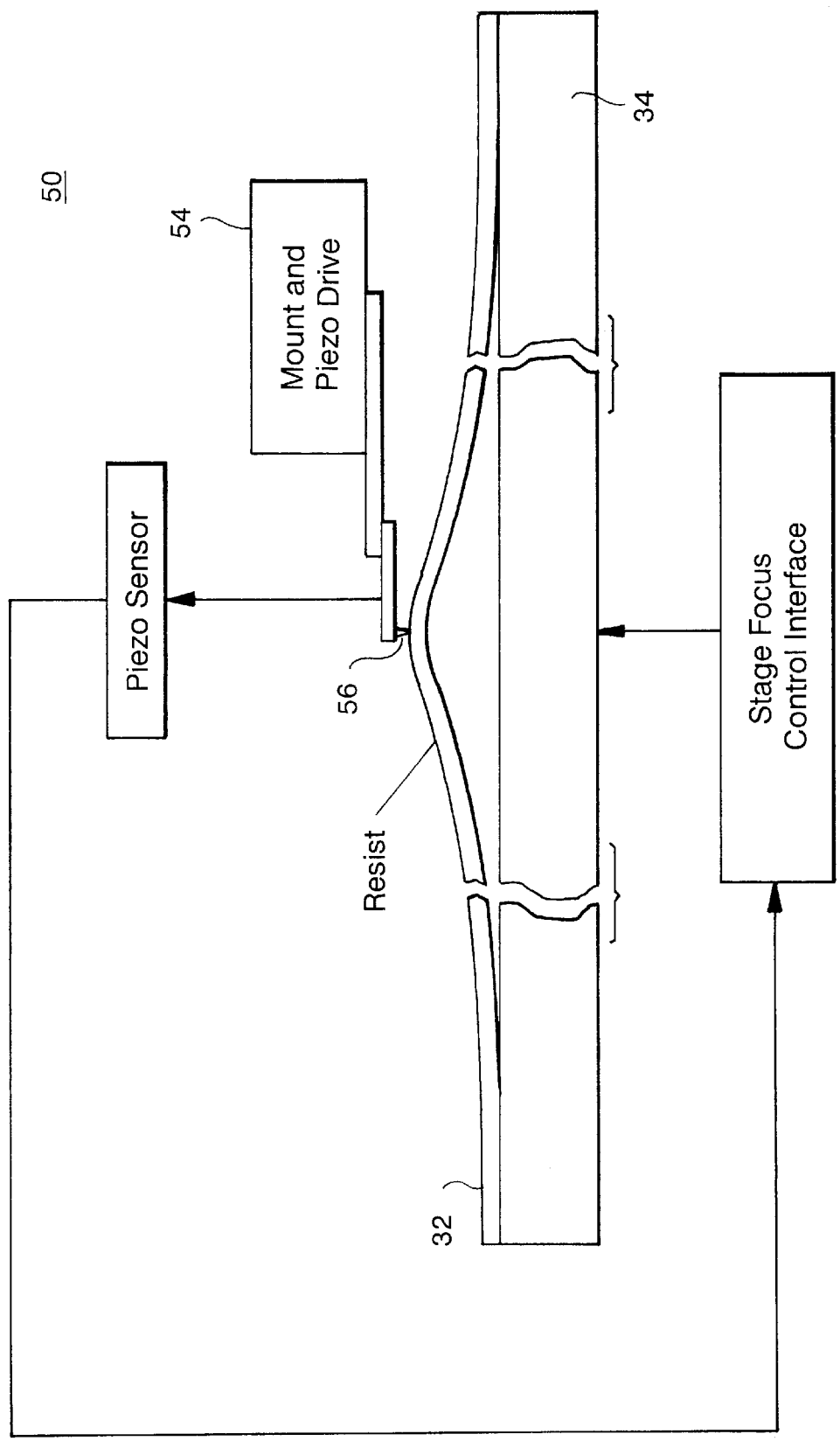
FIG. 4 shows a wafer positioning apparatus used with a wafer having a varying topology.

With reference to FIG. 4, the use of an SPM also allows determination of z position over various types of topography, to either adjust focus independently for different regions of the exposure field, or else more accurately determine best focal plane by eliminating uncertainties in z position caused by topography.

While it is apparent that the invention herein disclosed is well calculated to fulfill the objects previously stated, it will be appreciated that numerous modification and embodiments may be devised by those skilled in the art, and it is intended that the appended claims cover all such modifications and embodiments as fall within the true spirit and scope of the present invention.

Having thus described our invention, what we claim as new, and desire to secure by Letters Patent is:

1. A method for accurate photolithography tool Z axis positioning comprising:
   providing a photolithography tool having a scanned probe microscope mounted directly to the lens system hardware;
   determining a focal plane using calibration wafers;
   positioning a wafer at the scanner probe microscope tip; and
   driving a stage to move the wafer to the determined focal plane.

2. A method for positioning a wafer in an electron beam lithography system, comprising:
   positioning a scanned probe microscope in the lithography system;
   determining the distance between a preset location on the scanned probe microscope and a reference position in the lithography system;
   bringing the wafer into physical contact with said preset location; and
   moving the wafer a predetermined distance from the preset location in order to position the wafer at a focal plane in the lithography system.

3. A method according to claim 2, wherein the electron beam lithography system is used to direct an electron beam along a given axis and onto the wafer, and wherein:
   the moving step includes the step of moving the wafer along said given axis to position the wafer at said focal plane.

4. A method according to claim 3, wherein the electron beam lithography system includes a lens for focusing the electron beam onto the wafer, and the reference position is a fixed position relative to said lens.

5. A method according to claim 4, wherein the positioning step includes the step of mounting the scanned probe microscope onto the lens at a fixed position relative to the lens.

6. A method according to claim 5, wherein the scanned probe microscope includes a bottom tip, and the bringing step includes the step of bringing the wafer into contact with the bottom tip of the scanned probe microscope.

7. A method for dynamically positioning a wafer in an electron beam lithography system, comprising:
   positioning a scanned probe microscope in the lithography system;
   determining the distance between a preset location on the scanned probe microscope and a reference position in the lithography system;
   bringing the wafer into physical contact with said preset location;
   moving the wafer a predetermined distance from the preset location in order to position the wafer at a focal plane in the lithography system;
   moving the wafer within the lithography system to form patterns on a plurality of areas on the wafer; and
   repeating the steps of bringing the wafer into physical contact with said preset location and moving the wafer a predetermined distance, in order to position each of said plurality of areas at the focal plane when a pattern is being formed on the area.

8. A method according to claim 7, wherein the electron beam lithography system is used to direct an electron beam along a given axis and onto the wafer, and wherein:
   the step of moving the wafer a predetermined distance includes the step of moving the wafer along said given axis to position the wafer at said focal plane.

9. A method according to claim 8, wherein the electron beam lithography system includes a lens for focusing the electron beam onto the wafer, and the reference position is a fixed position relative to said lens.

10. A method according to claim 9, wherein the positioning step includes the step of mounting the scanned probe microscope onto the lens at a fixed position relative to the lens.

11. A method according to claim 10, wherein the scanned probe microscope includes a bottom tip, and the bringing step includes the step of bringing the wafer into contact with the bottom tip of the scanned probe microscope.

12. A system for positioning a wafer in an electron beam lithography system, comprising:
   a scanned probe microscope positioned in the lithography system;
   means for determining the distance between a preset location on the scanned probe microscope and a reference position in the lithography system;
   means for bringing the wafer into physical contact with said preset location; and
   means for moving the wafer a predetermined distance from the preset location in order to position the wafer at a focal plane in the lithography system.

13. A system according to claim 12, wherein the electron beam lithography system is used to direct an electron beam along a given axis and onto the wafer, and wherein:
   the moving means includes means for moving the wafer along said given axis to position the wafer at said focal plane.

14. A system according to claim 13, wherein the electron beam lithography system includes a lens for focusing the electron beam onto the wafer, and the reference position is a fixed position relative to said lens.

15. A system according to claim 14, further including means mounting the scanned probe microscope onto the lens at a fixed position relative to the lens.

16. A system according to claim 15, wherein the scanned probe microscope includes a bottom tip, and the bringing means includes means for bringing the wafer into contact with the bottom tip of the scanned probe microscope.

* * * * *